(12) United States Patent
Haratipour et al.

(10) Patent No.: US 11,063,131 B2
(45) Date of Patent: Jul. 13, 2021

(54) FERROELECTRIC OR ANTI-FERROELECTRIC TRENCH CAPACITOR WITH SPACERS FOR SIDEWALL STRAIN ENGINEERING

(71) Applicant: Intel Corporation, Santa Clara, CA (US)

(72) Inventors: Nazila Haratipour, Hillsboro, OR (US); Sou-Chi Chang, Portland, OR (US); Chia-Ching Lin, Portland, OR (US); Jack Kavalieros, Portland, OR (US); Uygar Avci, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/440,609

(22) Filed: Jun. 13, 2019

(65) Prior Publication Data

US 2020/0395460 A1 Dec. 17, 2020

(51) Int. Cl.
| | | |
|---|---|---|
| *B81B 3/00* | (2006.01) | |
| *H01L 21/00* | (2006.01) | |
| *H01L 29/51* | (2006.01) | |
| *H01L 29/15* | (2006.01) | |
| *H01L 29/221* | (2006.01) | |
| *H01L 29/94* | (2006.01) | |

(52) U.S. Cl.
CPC .......... *H01L 29/516* (2013.01); *H01L 29/151* (2013.01); *H01L 29/221* (2013.01); *H01L 29/945* (2013.01)

(58) Field of Classification Search
CPC ................. H01L 29/7842–7849; H01L 33/12

USPC .......... 438/3, 50–52; 257/254, 295, 417–420
See application file for complete search history.

(56) References Cited

U.S. PATENT DOCUMENTS

| | | | | |
|---|---|---|---|---|
| 6,974,985 | B2 * | 12/2005 | Kurasawa | ............... H01L 28/55 257/296 |
| 7,781,284 | B2 * | 8/2010 | Sashida | ............... H01L 21/0234 438/239 |
| 2007/0235787 | A1 * | 10/2007 | Nagano | ................... H01L 28/55 257/301 |
| 2019/0013459 | A1 * | 1/2019 | Kijima | .................. H01L 41/314 |

OTHER PUBLICATIONS

Muller, Johannes et al., "Ferroelectricity in Simple Binary ZrO2 and HfO2", Nano Letters 2012, 6 pgs.
Pesic, M. et al., "Anti-ferroelectric ZrO2: An Enable for Low Power Non-volatile 1T-1C and 1T Random Access Memories", 2017 IEEE, 4 pgs.

* cited by examiner

*Primary Examiner* — Calvin Lee
(74) *Attorney, Agent, or Firm* — Green, Howard & Mughal LLP

(57) ABSTRACT

Described is a ferroelectric-based capacitor that improves reliability of a ferrhoelectric memory by providing tensile stress along a plane (e.g., x-axis) of a ferroelectric or anti-ferroelectric material of the ferroelectric/anti-ferroelectric based capacitor. Tensile stress is provided by a spacer comprising metal, semimetal, or oxide (e.g., metal or oxide of one or more of: Al, Ti, Hf, Si, Ir, or N). The tensile stress provides polar orthorhombic phase to the ferroelectric material and tetragonal phase to the anti-ferroelectric material. As such, memory window and reliability of the ferroelectric/anti-ferroelectric oxide thin film improves.

11 Claims, 12 Drawing Sheets

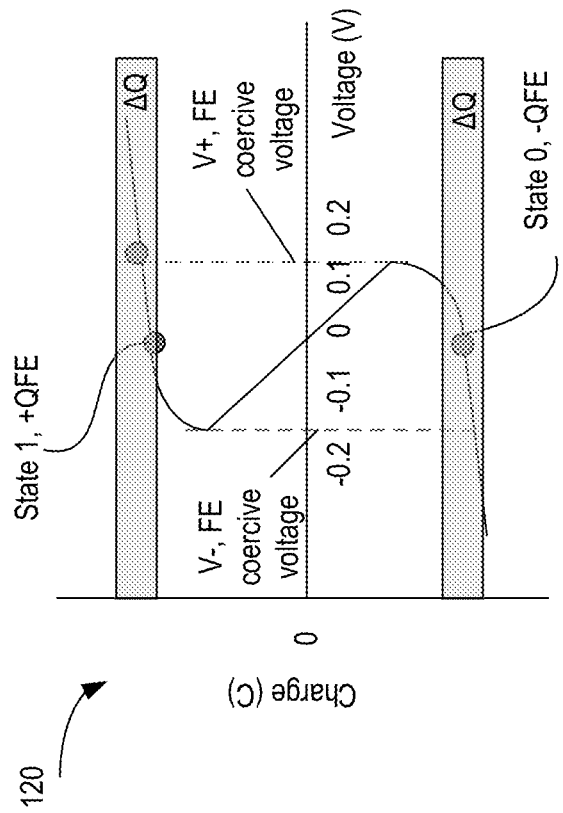
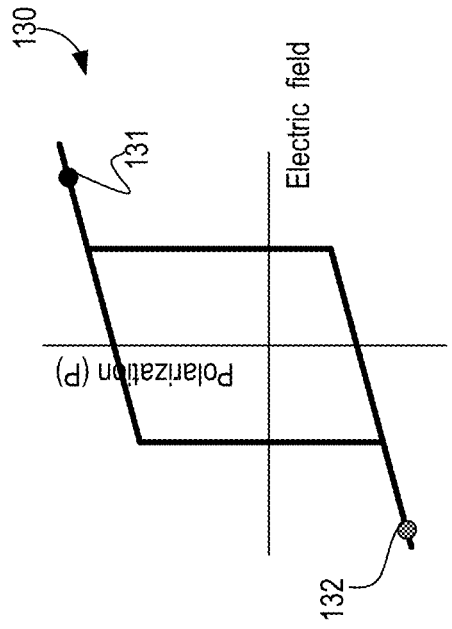
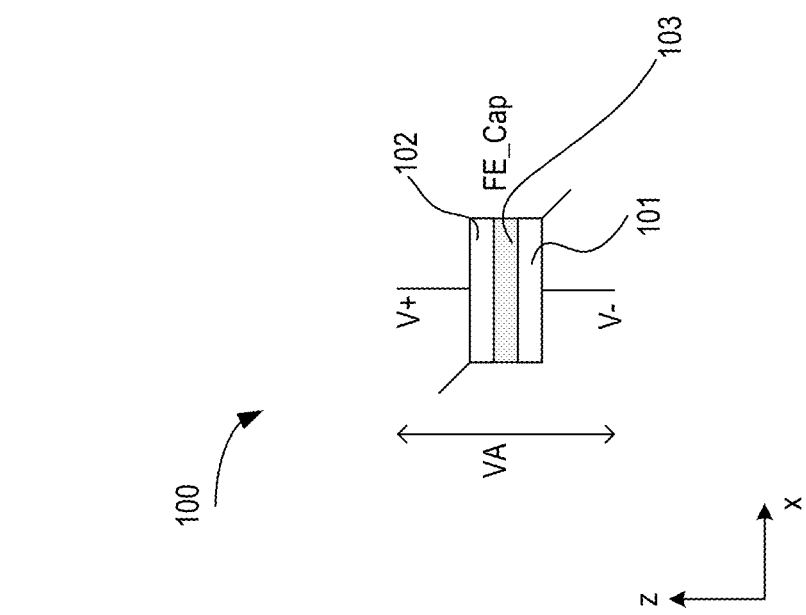
Fig. 1B
Fig. 1C
Fig. 1A

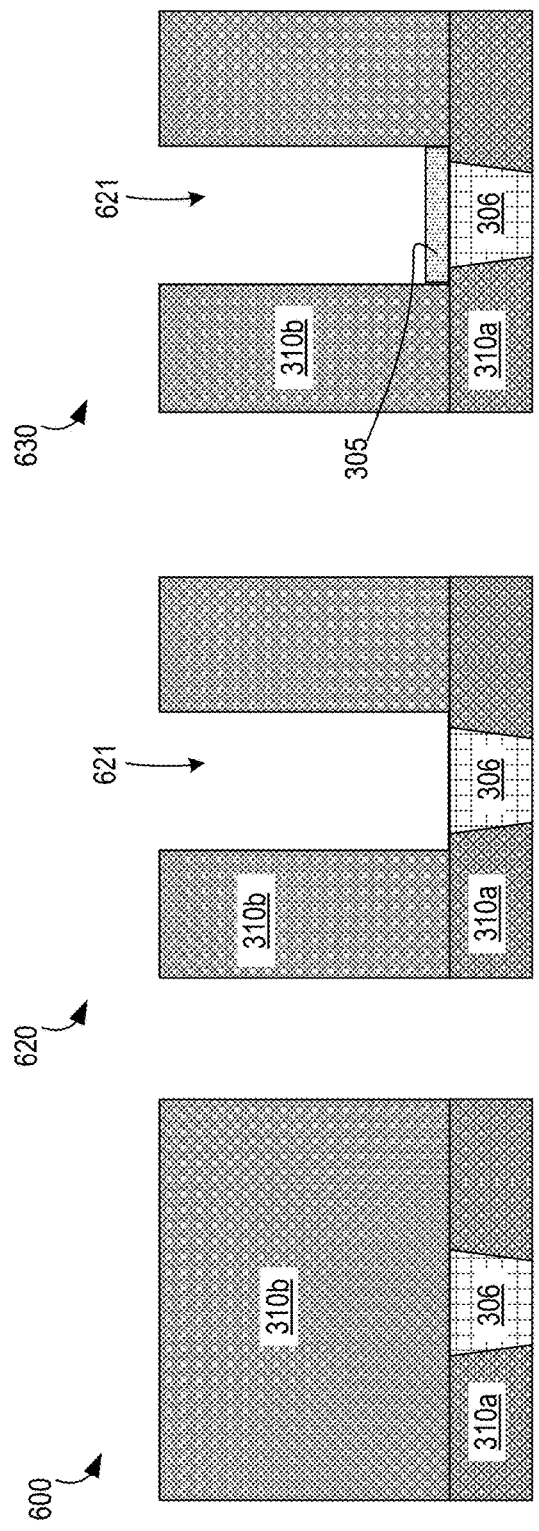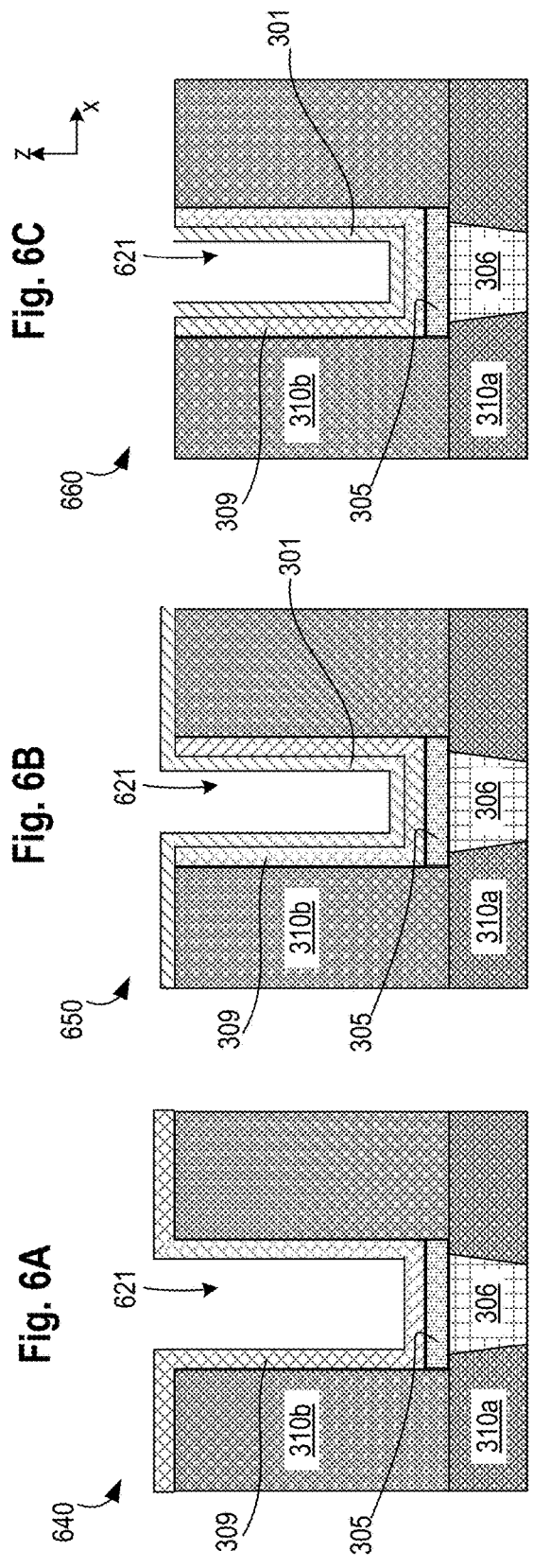

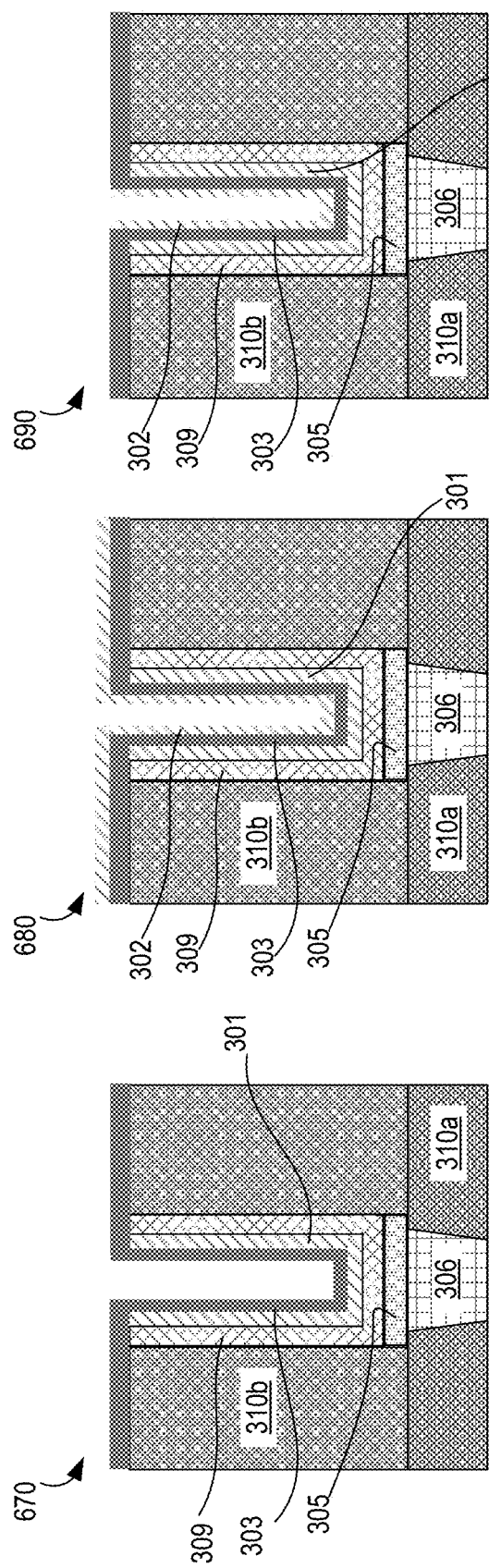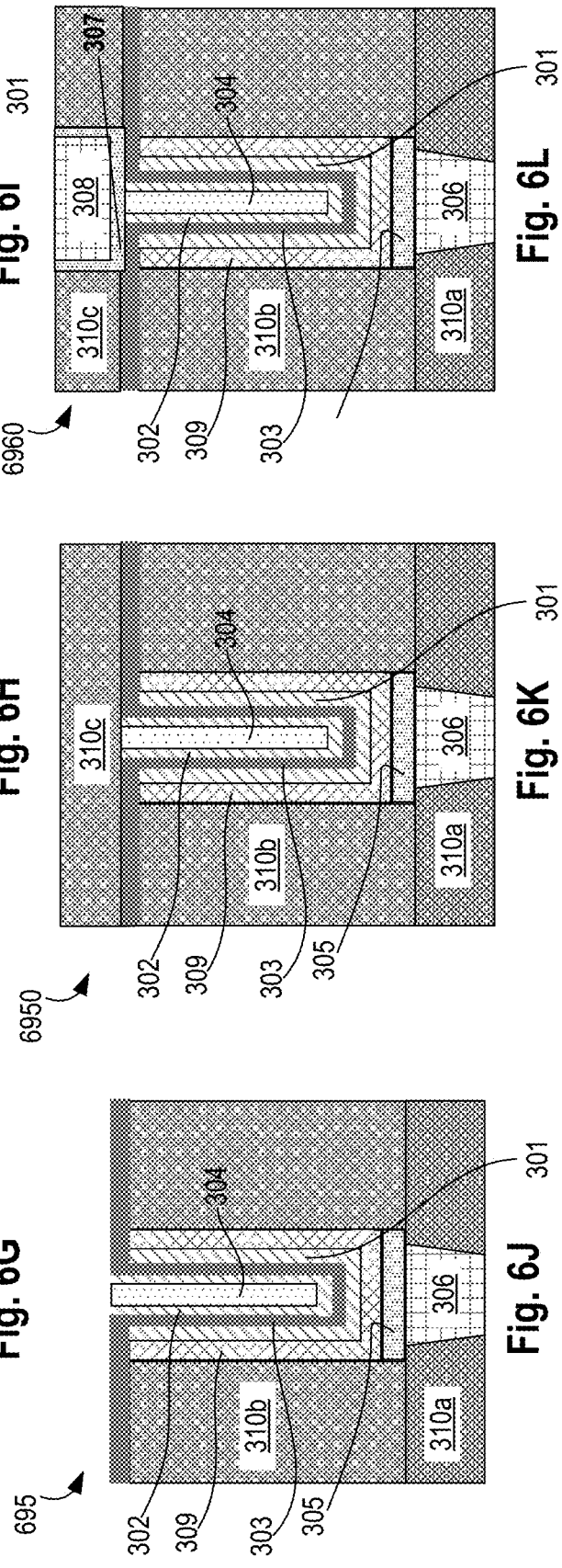

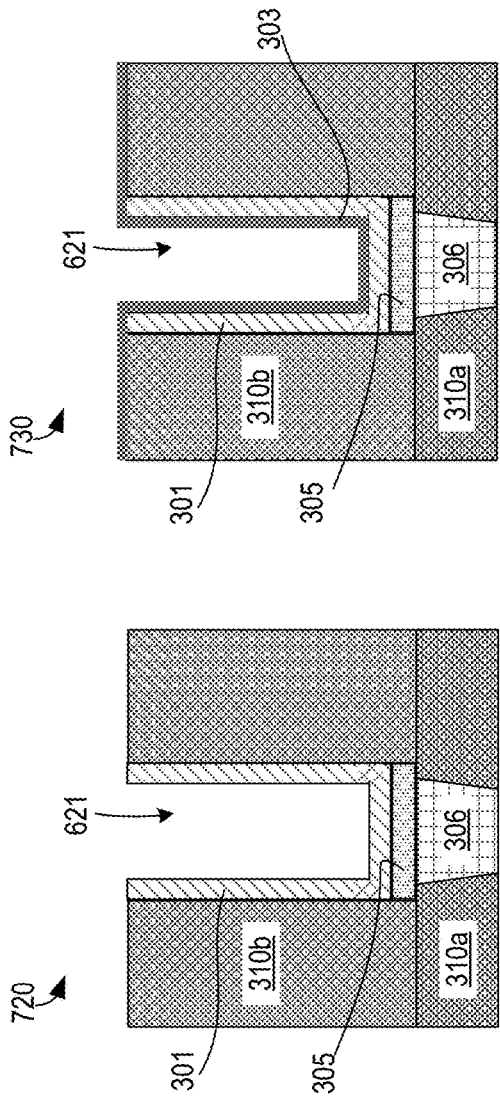
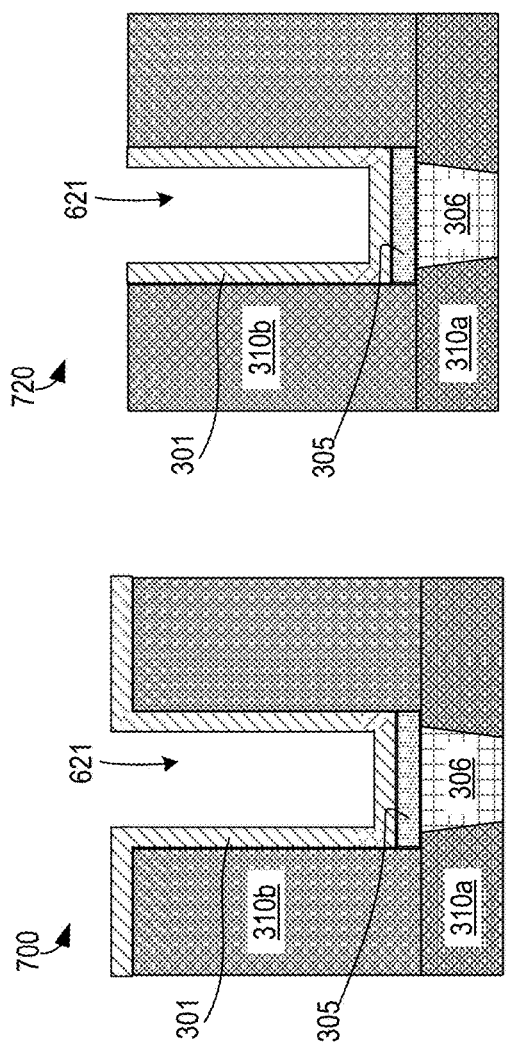
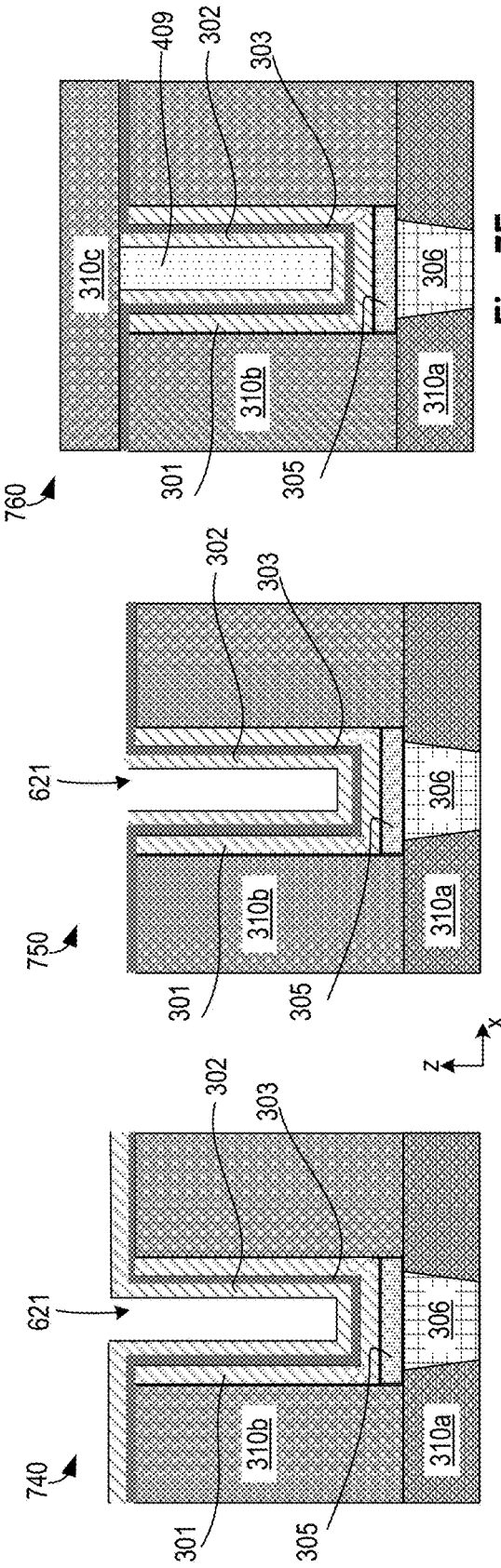
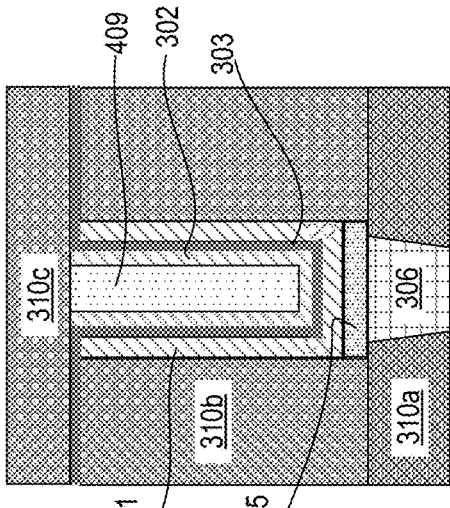

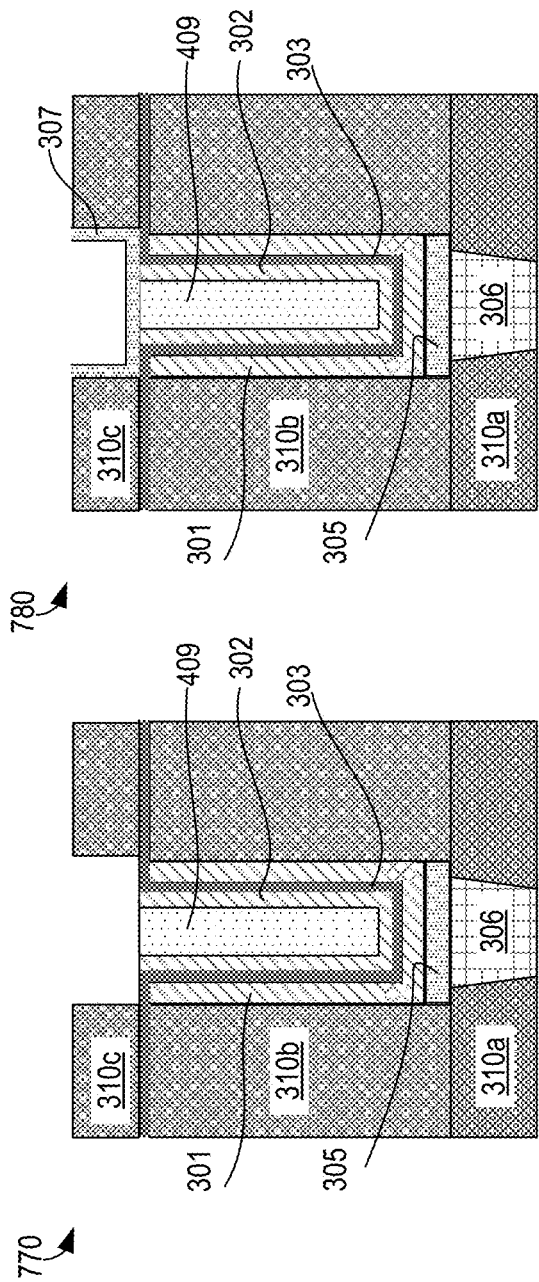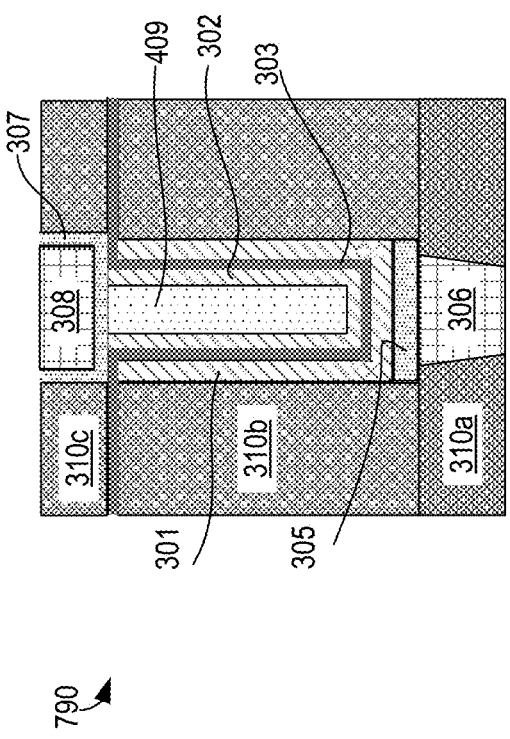

US 11,063,131 B2

FERROELECTRIC OR ANTI-FERROELECTRIC TRENCH CAPACITOR WITH SPACERS FOR SIDEWALL STRAIN ENGINEERING

BACKGROUND

Devices such as high charge capacity capacitors (e.g., metal-insulator-metal (MIM) capacitors) for backend can be formed as passive circuit elements or transistors (e.g., metal-oxide-semiconductor (MOS) transistors) for frontend as active circuit elements. Passive circuit elements can be used to provide charge storage and sharing, while active circuit elements can be used to enable low voltage and high current power supply. Thin-film capacitors enable low-voltage operation. However, traditional thin-film ferroelectric capacitors have low retention and also weak polarization due to strong depolarization. New materials and/or stack design are desired to enable ferroelectric capacitors with longer retentions and high charge density.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a schematic of a ferroelectric capacitor (FE-Cap).

FIG. 1B illustrates a plot showing charge versus voltage function of the FE-Cap, its memory states, and imprint charge.

FIG. 1C illustrates a plot showing hysteresis property of ferroelectric material, in accordance with some embodiments.

FIGS. 6A-6L illustrate cross-sections of a device showing fabrication of capacitive structure of FIG. 3B, in accordance with some embodiments.

FIGS. 7A-7I illustrate cross-sections of a device showing fabrication of capacitive structure of FIG. 4B, in accordance with some embodiments.

DETAILED DESCRIPTION

Figure 2:
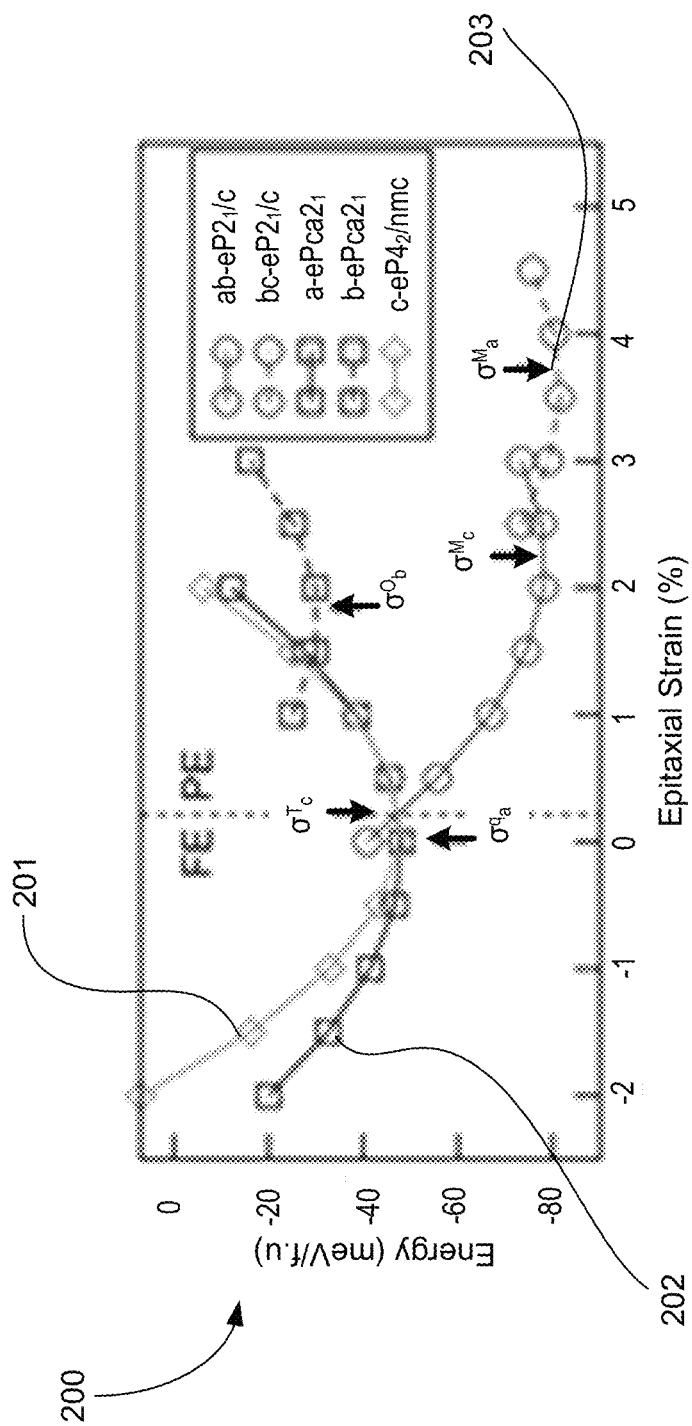
FIG. 2 illustrates a plot showing epitaxial strain for a FE material (e.g., ZrO2).

Hafnium (Hf) and Zirconium (Zr) based ferroelectric or anti-ferroelectric oxide thin films are promising options for the next generation of front-end or back-end embedded dynamic random access memory (DRAM), high-density memory, and metal-insulator-metal (MIM) capacitor due to their scalability. However, the most stable phase (i.e., the lowest energy configuration in the energy landscape) of Hf and Zr-based oxide is the monoclinic phase which is a non-polar phase. If the ratio of monoclinic phase in oxide is increased, the memory window will be lower. Also, for long endurance cycles, polar orthorhombic phase (or tetragonal phase) gradually changes to monoclinic phase or a number of pinned polar domains increase during electric field cycling, which is a reliability issue for the ferroelectric/anti-ferroelectric oxides. Depending on the doping concentration in Hf-doped or Zr-doped oxide, ferroelectric or anti-ferroelectric behavior can be observed.

One way to improve reliability of the ferroelectric/anti-ferroelectric oxide is to use different doping, thickness, annealing methods, interface treatments, and Atomic Layer Deposition (ALD) deposition sequences. However, such methods show little improvement to memory window and reliability. The challenge of achieving higher endurance cycles (e.g., greater than $10^{12}$) at high temperatures (e.g., over 80 degree Celsius) for existing ferroelectric/anti-ferroelectric based capacitors remains real.

In some embodiments, non-polar monoclinic phase is reduced and polar orthorhombic or tetragonal phase is increased by epitaxial strain engineering in the ferroelectric/anti-ferroelectric oxide thin film and/or electrodes. In some embodiments, a capacitive structure is provided which comprises: a first structure comprising metal; a second structure comprising metal; a third structure comprising ferroelectric/anti-ferroelectric material, wherein the third structure is between and adjacent to the first and second structures; and a fourth structure adjacent to the first structure, wherein the fourth structure is to provide tensile stress to the ferroelectric or anti-ferroelectric material, wherein the fourth structure comprises metal, semimetal, or oxide. In some embodiments, the fourth structure includes an oxide of one or more of: Al, Ti, Hf, Si, Ir, or N. In some embodiments, the fourth structure has a thickness in a range of 5 A to 100 A. In some embodiments, the capacitive structure comprises a fifth structure adjacent to the first structure, wherein the fifth structure comprises a barrier material, which includes Ta and N. In some embodiments, the ferroelectric/anti-ferroelectric material includes one or more of: Hf or Zr, wherein the ferroelectric material has polar orthorhombic phase while the anti-ferroelectric material has tetragonal phase. In some embodiments, the ferroelectric material includes one or more of: Pb, Ti, Zr, Ba, N Si, La, Al, or Hf (e.g., Al doped HfO2); wherein the ferroelectric material has polar orthorhombic phase and anti-ferroelectric material has tetragonal phase. In some embodiments, the ferroelectric material has a thickness in a range of 2 nm to 20 nm. In some embodiments, the ferroelectric material is a super lattice of a first material and a second material, wherein the first material includes one of: $PbTiO_3$ (PTO), $SrZrO_3$, or FeO3, and wherein the second material includes one of: $SrTiO_3$ (STO), $BaZrO_3$, or $YTiO_3$. The strain engineering is achieved that suppresses the non-polar monoclinic phase and increases the orthorhombic or tetragonal phase. Strain engineering dramatically improves the memory window and reliability of the ferroelectric/anti-ferroelectric oxide thin film. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. In some case, scaling to another process technology node also results into upsizing devices and their layout. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates a schematic of a ferroelectric/anti-ferroelectric capacitor (FE-Cap) 100. FIG. 1B illustrates plot 120 showing charge versus voltage function of the FE-Cap, its memory states, and imprint charge. FE-cap 100 generally comprises two metal layers 101 and 102 and ferroelectric material 103 coupled between them. Unlike a normal dielectric based capacitor, a ferroelectric capacitor uses polarization charge to store the memory states, where positive and negative polarization charge indicates state "1" or "0". To switch an FE-cap, the applied FE-cap voltage VA is be higher than the ferroelectric coercive voltages (which behave as threshold voltages) when driven by a voltage source. For example, VA is greater than V+ for 0 to 1 state switching, and VA is less than V− for 1 to 0 state switching.

FIG. 1C illustrates plot 130 showing hysteresis property of ferroelectric material 103, in accordance with some embodiments. A ferroelectric material exhibits ferroelectricity which is a property by which a spontaneous electric polarization can be revered by an electric field (e.g., applied voltage). When dielectric materials are polarized, the induced polarization 'P' is almost exactly proportional to the applied external electric field E. In such materials, the polarization is a linear function of the applied electric field or voltage. Ferroelectric materials, on the other hand, demonstrate a spontaneous non-zero polarization even when the applied electric field E is zero. As such, the spontaneous polarization can be reversed by an applied electric field in the opposite direction. This results in a hysteresis loop because the polarization of a ferroelectric material is dependent not only on the present electric field but also on its history. The hysteresis loop of plot 130 shows two stable operating positions for FE 103—position 131 and position 132. These two stable positions indicate that the direction of polarization can be switched (e.g., polled) from one to another and this changes the response of polarization to applied AC voltage. Note, for anti-ferroelectric behavior, a double hysteresis loop is observed. Depending on the doping amount, either a ferroelectric or anti-ferroelectric property in the material can be achieved.

FIG. 2 illustrates plot 200 showing epitaxial strain for a FE material (e.g., ZrO2). Here, the x-axis is epitaxial strain (%) while y-axis is energy. There are 4 phases in Hf and Zr-based thin film oxide. Cubic phase is the high-energy phase. Tetragonal phase (e.g., 201) is the anti-ferroelectric phase. Orthorhombic phase (e.g., 202) is a ferroelectric phase (polar phase). Monoclinic phase (e.g., 203) is the lowest energy and most stable phase, but it is a non-polar phase. To have ferroelectric property memory or MIM capacitor, monoclinic phase 203 is suppressed so get more orthorhombic and tetragonal phases. In some embodiments, monoclinic phase can be suppressed with compressive strain in ferroelectric oxide. In capacitor structure where ferroelectric oxide is between electrodes (e.g., FIG. 1A), low memory window is observed with electrodes (101, 102) with tensile strain to ferroelectric oxide 103.

Figure 3A:
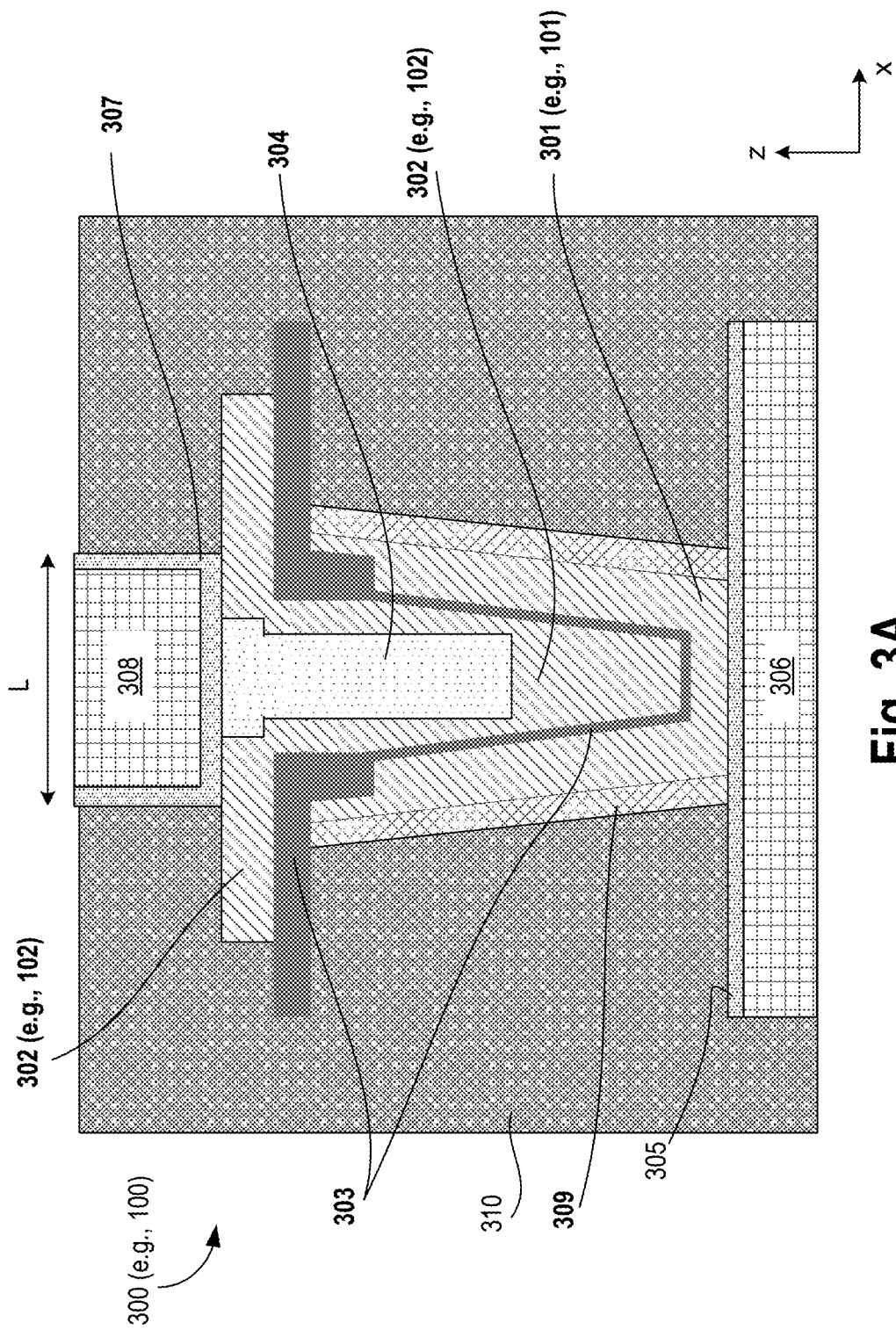
FIGS. 3A-B illustrate cross-sections of capacitor over bit-line (COB) with outer spacers to provide tensile stress to ferroelectric material of the COB, in accordance with some embodiments of the disclosure.
Figure 3B:
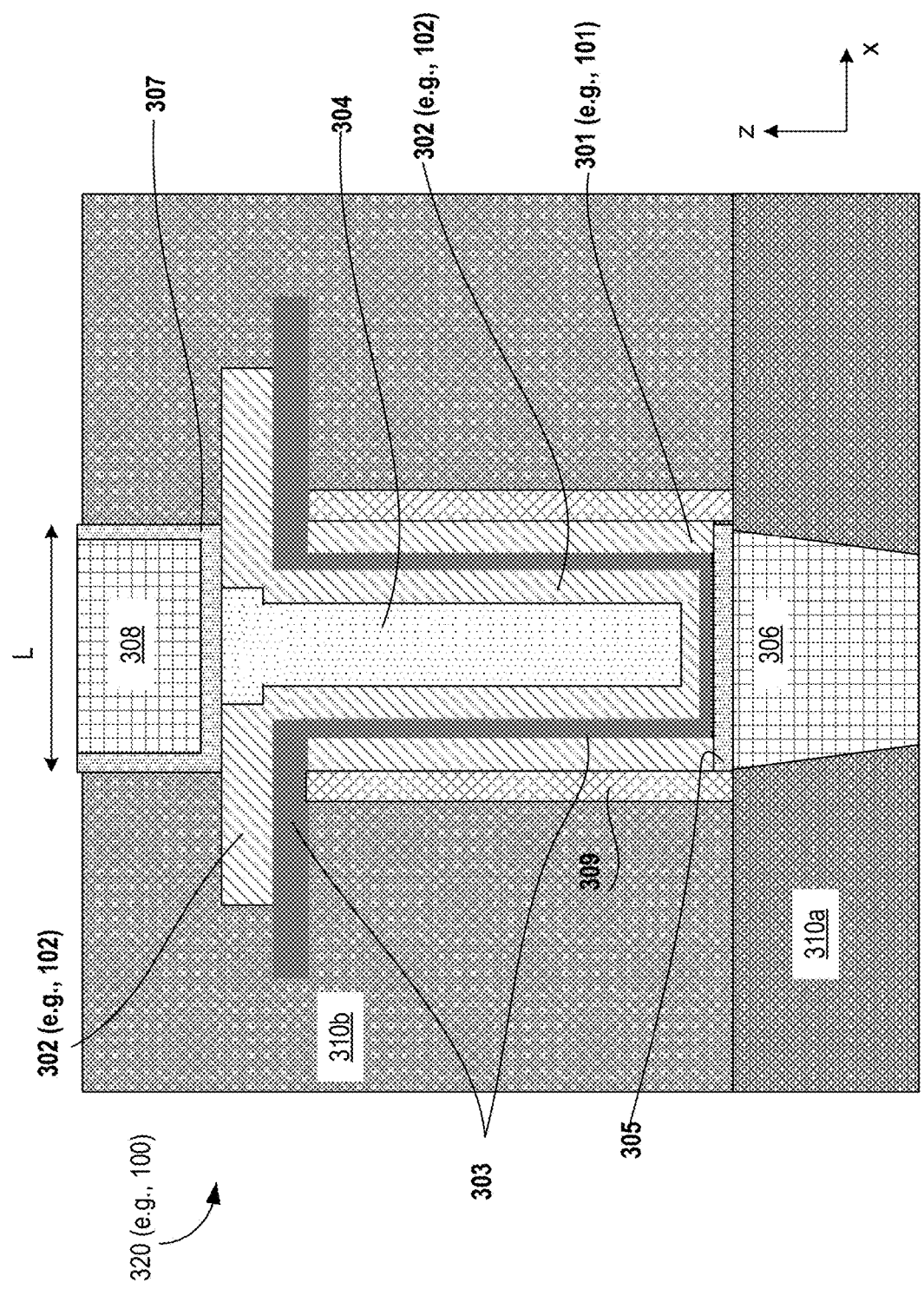

FIGS. 3A-B illustrate cross-sections 300 and 320, respectively, of capacitor over bit-line (COB) with outer spacers to provide tensile stress to ferroelectric material of the COB, in accordance with some embodiments of the disclosure. Both capacitive structures 300 and 320 have similar functions but slightly different structures. Capacitive structure 300 is a trench capacitor that takes the form of a v-shaped via. Capacitive structure 320 is also a trench capacitor that is rectangular. The organization of the various layers, and their thicknesses are comparable between the two types of trench capacitors. In some embodiments, COB 300 comprises first electrode 301 (e.g., 101), second electrode 302 (e.g., 102), ferroelectric material 303, metal structure (of via) 304, first barrier 305, first interconnect 306, second barrier 307, second interconnect 308, and spacer 309. Bottom electrode 301 is coupled to first interconnect 306 via a barrier layer 305 while top electrode 304 is coupled to second interconnect 308 via metal via 304 and second barrier 307. COB 300 and 320 are formed in oxide 310 (e.g., SiO2). Other insulating material can also be used for material 310.

In COB configurations, in various embodiments, stacked memory capacitors are fabricated above an access transistor in the back-end interconnect portion of the process flow. In some embodiments, first and second electrodes 301 and 302, respectively, comprise any metallic materials that have lattice constant smaller than 5.0 A. In some embodiments, first and second electrodes 301 and 302, respectively, are crystalline or amorphous. In some embodiments, first and second electrodes 301 and 302, respectively, comprise metal including one or more of: TiN, RuO, TaN, IrO, Ru, Ir, W, Cu, Al, graphene, carbon nanotube (CNT), Ag, Co, or Ti. In various embodiments, first and second electrodes 301 and 302, respectively, comprise material, which can be deposited by atomic layer deposition (ALD) or chemical vapor deposition (CVD).

In various embodiments, first electrode 301 is adjacent to a spacer layer 309. Spacer layer 309 applies tensile strain to ferroelectric material 303 so that the non-polar monoclinic phase of material 303 is suppressed and the orthorhombic phase or tetragonal phase is increased. Strain engineering by layer 309 dramatically improves the memory window and reliability of the ferroelectric oxide thin film 303. In this case, tensile strain is provided from outside in. For example, spacers 309 formed along the outer walls of the first electrode 301 provide tensile strain inwards to material 303 so that material 303 becomes a stable ferroelectric material. In various embodiments, any low-leakage amorphous/polycrystalline/single crystalline spacer can be used for layer 309. The thickness of layer 309 along the z-axis ranges from 5A to 200A. Example material for layer 309 include: metal, semimetal, or oxide. Spacer 309 can be deposited by ALD or CVD. In some embodiments, spacer layer 309 includes one of: Al2O3, TiO2, HfO2, SiNx, SiO2, SiN, AlSiN, carbon-doped nitride, carbon-doped oxide, TiN, TiSiN, W, or TaN.

In some embodiments, ferroelectric material 303 employed in the ferroelectric capacitor 300 may include, for example, materials exhibiting ferroelectric behavior at thin dimensions (e.g., between 1 nm and 30 nm), such as hafnium or zirconium-based oxide (Hf or Zr-based oxide). The thickness of FE/AFE (ferroelectric/anti-ferroelectric) material 103 along the z-axis is in a rage of 2 nm to 30 nm. The ferroelectric/anti-ferroelectric material 303 includes materials such as: hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium), lead zirconate titanate (which is a material that includes lead, zirconium, and titanium), barium zirconate titanate (which is a material that includes barium, zirconium and titanium), and combinations thereof. Some embodiments include hafnium, zirconium, barium, titanium, and/or lead, and combinations thereof for FE/AFE material 303. In some embodiments, ferroelectric material include perovskite ferroelectrics such as NH4H2PO4, KH2PO4, LiNbO3, LiTaO3, BaTiO3, PbTiO3, Pb (Zr,Ti) O3, (Pb,La)TiO3, and (Pb,La)(Zr,Ti)O3. In some embodiments, anti-ferroelectric material includes one or more of: PbZrO3 (Lead Zirconate), NH4H2PO4 (ADP—Ammonium dihydrogen Phosphate), or NaNbO3 (Sodium Niobate).

In some embodiments, first and second interconnects 306 and 308 include one or more of: Cu, Al, graphene, CNT, Au, Co, W, or TiN. In some embodiments, barrier layers 305 and 307 are provided between the interconnects and electrodes. In various embodiments, these barrier layers are diffusion barriers and may comprise TaN or TiN. Barrier layers 305 and 307 include one or more of: TiN, TaN, graphene, MX2 or M2X, and transition metal dichalcogenides such as MoS2, MoSe2, Cu2S etc. The thickness 't' along the z-axis for barrier layers 305 and 307 is 5 A to 40 A.

Figure 4A:
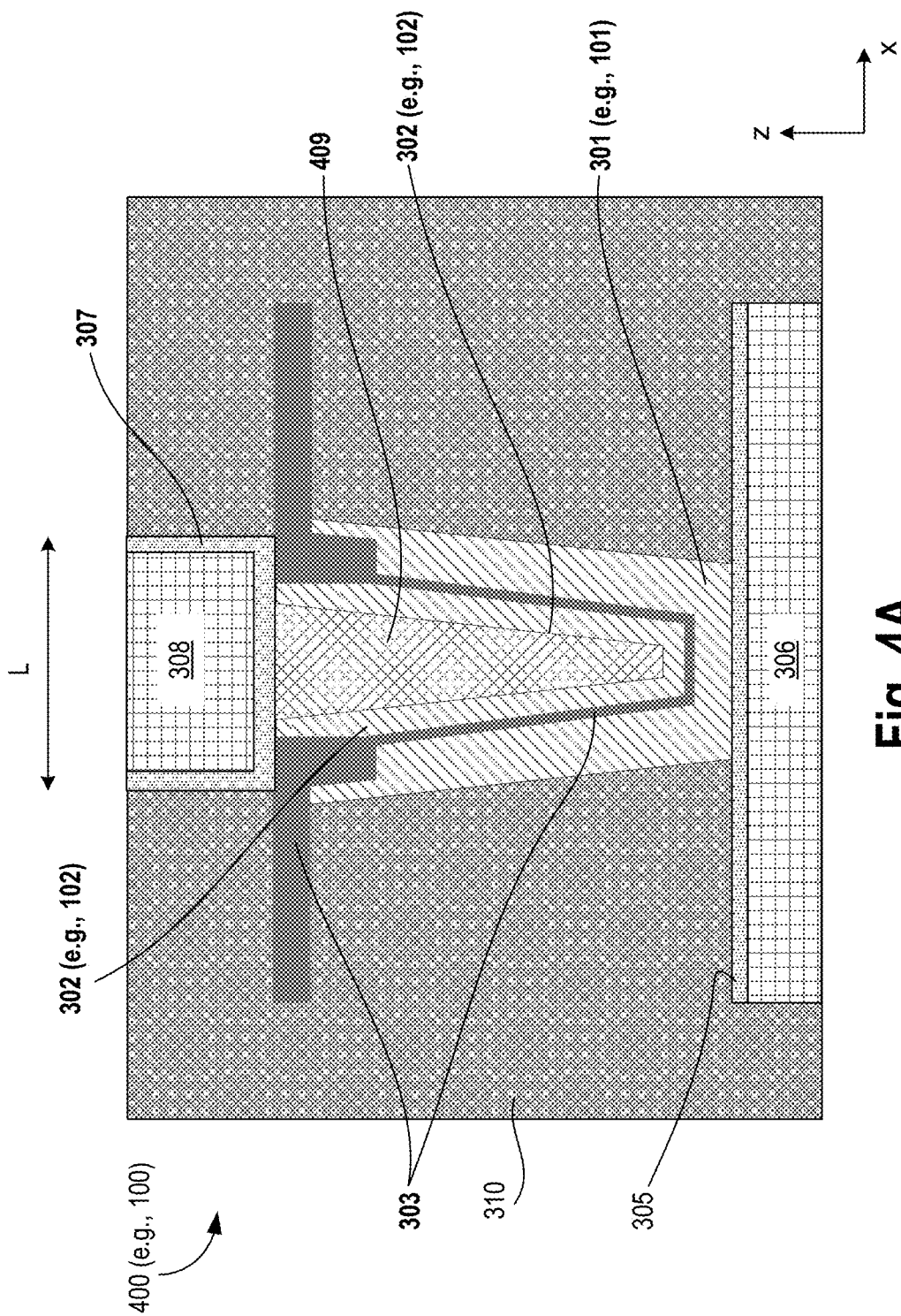
FIGS. 4A-B illustrate cross-sections of COB with core fills (e.g., air, oxide, metal) to provide tensile stress to ferroelectric material of the COB, in accordance with some embodiments of the disclosure.
Figure 4B:
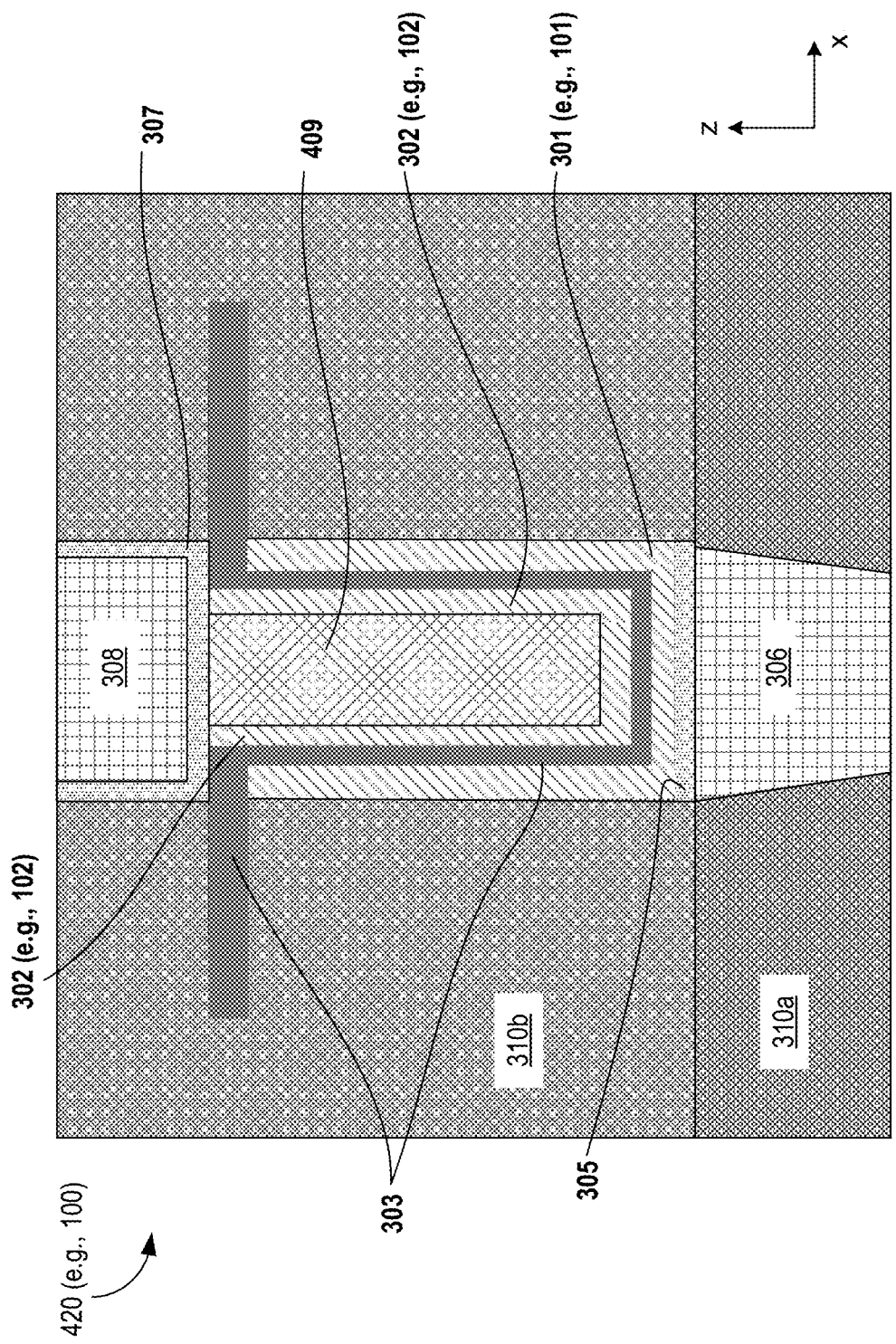

FIGS. 4A-B illustrate cross-sections 400 and 420 of capacitor over bit-line (COB) with core fills (e.g., air, oxide, metal) to provide tensile stress to ferroelectric material of the COB, in accordance with some embodiments of the disclosure. Both capacitive structures 400 and 420 have similar functions but slightly different structures. Capacitive structure 400 is a trench capacitor that takes the form of a v-shaped via. Capacitive structure 420 is also a trench capacitor that is rectangular. The organization of the various layers, and their thicknesses are comparable between the two types of trench capacitors of FIGS. 4A-B.

Compared to the capacitive structures of FIGS. 3A-B, here, tensile strain is provided to material 303 via an internal spacer 409. Spacer 409 takes place of metal structure or via 304. In some embodiments, spacer 409 is an air gap. In some embodiments, spacer 409 is one of metal, semimetal, or oxide. In some embodiments, spacer layer 409 includes one of: SiN, SiON, AlSiN, Al2O3, TiO2, HfO2, SiNx, SiO2, C-doped nitride, C-doped oxide, W, TiN, TiSiN, Co, TaN, or Cu. In various embodiments, second electrode 302 is adjacent to a spacer 409. Spacer structure 409 applies tensile strain to ferroelectric material 303 so that the non-polar monoclinic phase of material 303 is suppressed and the orthorhombic or tetragonal phase is increased. Strain engineering by spacer 409 dramatically improves the memory window and reliability of the ferroelectric oxide thin film 303. In this case, tensile strain is provided from inside out. For example, spacers 409 formed in the inner core of the capacitive structure, and provides tensile strain outwards to material 303 so that material 303 becomes a stable ferroelectric material. In various embodiments, any low-leakage amorphous/polycrystalline/single crystalline spacer can be used for layer 409. The thickness of layer 409 along the z-axis ranges from 5A to 100A. Spacer 409 can be deposited by ALD or CVD.

In some embodiments, tensile strain is provided to material 303 by spacers 309 and spacer 409. In some example, the embodiments of FIGS. 3A-B are combined with embodiments of FIGS. 4A-B to provide two simultaneous ways of providing tensile strain to material 303 so that material 303 acquires a sable orthorhombic phase resulting in a stable ferroelectric material.

While the various embodiments illustrates COB or COB-like capacitive structures, the embodiments are also applicable to MIM capacitors. An example of MIM capacitor is shown in FIG. 1A. By placing spacers along the z-axis, tensile strain can be applied to the FE material 103.

Figure 5:
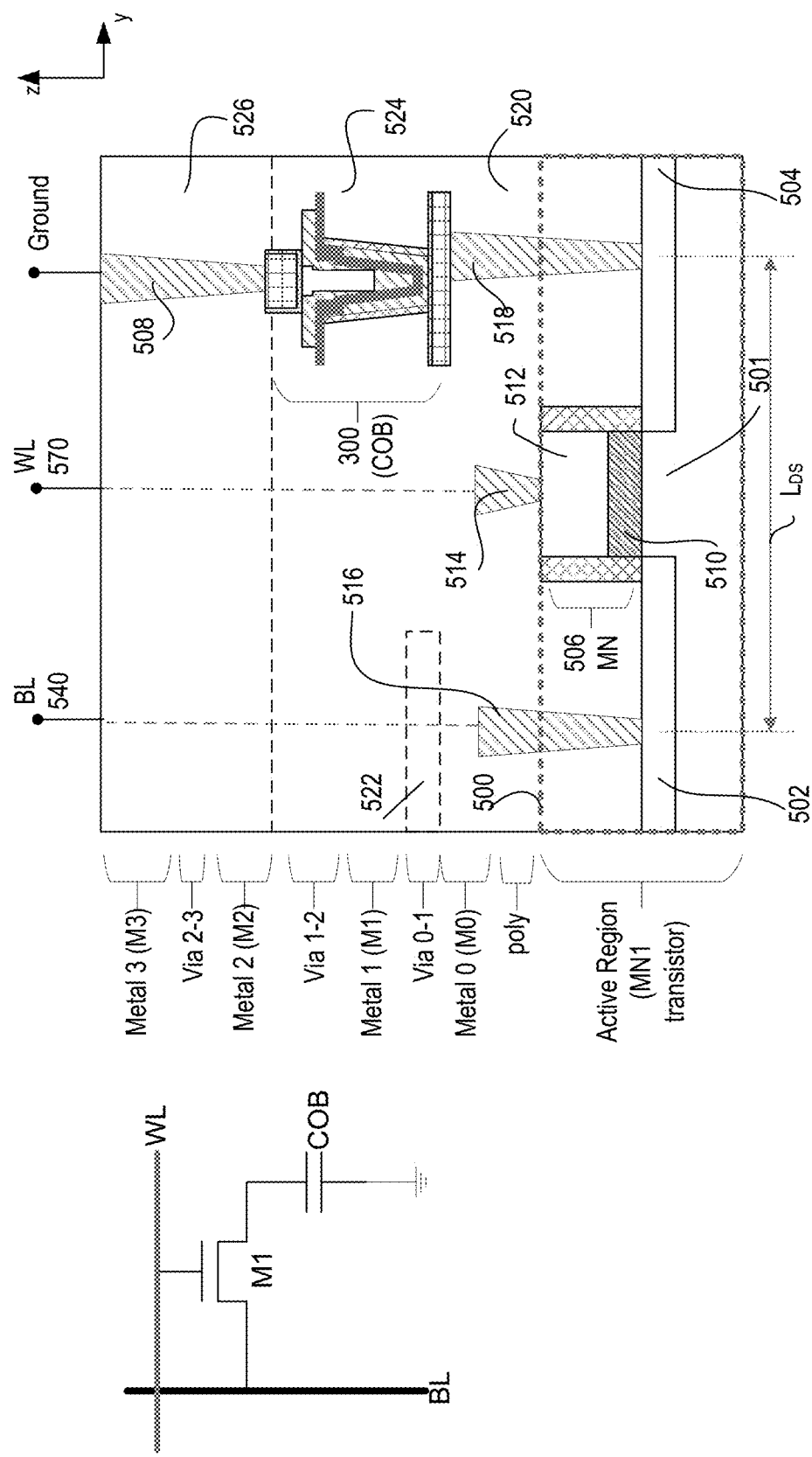
FIG. 5 illustrates a cross-section of an embedded dynamic random access memory (eDRAM) comprising COB of any one of FIGS. 3-4, in accordance with some embodiments of the disclosure.

FIG. 5 illustrates a cross-section of an embedded dynamic random access memory (eDRAM) comprising COB of any one of FIGS. 3-4, in accordance with some embodiments of the disclosure. For sake of example, capacitive structure 300 is shown. However, capacitive structures 320, 400, 420, and their combinations can also be used instead of capacitive structure 300.

In some embodiments, transistor 500 has source region 502, drain region 504 and gate 506. Transistor 500 (e.g., n-type transistor M1) further includes gate contact 514 disposed above and electrically coupled to gate 506, source contact 516 disposed above and electrically coupled to source region 502, and drain contact 518 disposed above and electrically coupled to drain region 504. In various embodiments, COB 300, 320, 400, 420 (or their combinations) is disposed above transistor 500 such that electrode 308 is coupled to via or metal structure 508A, and electrode 306 is coupled to via 518.

In some embodiments, gate contact 514 is directly below COB 300, 320, 400, 420 (or their combinations). In some embodiments, word-line (WL) contact 570 is disposed onto gate contact 514 on a second y-z plane behind (into the page) first y-z plane metal 522a.

In some embodiments, transistor 500 associated with substrate 501 is a metal-oxide-semiconductor field-effect transistor (MOSFET or simply MOS transistors), fabricated on substrate 501. In various embodiments of the present disclosure, transistor 500 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, transistor 500 is a tri-gate transistor.

Here, COB 300, 320, 400, 420 (or their combinations) stores data. For simplicity purposes, FIG. 5 is illustrated with reference to COB 300, but other capacitor forms with spacers that provide tensile stress of material 303 can also be used. Data is written into COB 300 as charge via bit-line (BL) 540 when access transistor M1 is turned on by applying voltage on word-line WL 570.

In some embodiments, the underlying substrate 501 represents a surface used to manufacture integrated circuits. In some embodiments, substrate 501 includes a suitable semiconductor material such as but not limited to, single crystal silicon, polycrystalline silicon and silicon on insulator (SOI). In another embodiment, substrate 501 includes other semiconductor materials such as germanium, silicon germanium, or a suitable group III-V or group III-N compound. Substrate 501 may also include semiconductor materials, metals, dopants, and other materials commonly found in semiconductor substrates.

In some embodiments, transistor 500 includes a gate stack formed of at least two layers, gate dielectric layer 510 and gate electrode layer 512. Gate dielectric layer 510 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 510 to improve its quality when a high-k material is used.

Gate electrode layer 512 of transistor 500 is formed on gate dielectric layer 510 and may comprise of at least one P-type work-function metal or N-type work-function metal, depending on whether the transistor is to be a PMOS or an NMOS transistor. In some embodiments, the gate electrode layer 512 may comprise of a stack of two or more metal layers, where one or more metal layers are work-function metal layers and at least one metal layer is a conductive fill layer.

For a PMOS transistor, metals that may be used for gate electrode layer 512 include, but are not limited to, ruthenium, palladium, platinum, cobalt, nickel, and conductive metal oxides, e.g., ruthenium oxide. A P-type metal layer will enable the formation of a PMOS gate electrode layer 512 with a work-function that is between about 4.9 eV and about 5.2 eV. For an NMOS transistor, metals that may be used for gate electrode layer 512 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of NMOS gate electrode layer 512 with a work-function that is between about 3.9 eV and about 4.2 eV.

In some embodiments, gate electrode layer 512 may comprise a "U"-shaped structure that includes a bottom portion substantially parallel to the surface of the substrate and two sidewall portions that are substantially perpendicular to the top surface of the substrate. In another embodiment, at least one of the metal layers that form gate electrode layer 512 may simply be a planar layer that is substantially parallel to the top surface of the substrate and does not include sidewall portions substantially perpendicular to the top surface of the substrate. In some embodiments of the present disclosure, the gate electrode layer 512 may comprise of a combination of U-shaped structures and planar, non-U-shaped structures. For example, gate electrode layer 512 may comprise of one or more U-shaped metal layers formed atop one or more planar, non-U-shaped layers.

In some embodiments, a pair of gate dielectric layer 510 may be formed on opposing sides of the gate stack that bracket the gate stack. Gate dielectric layer 510 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 502 and drain region 504 are formed within the substrate adjacent to the gate stack of transistor 500. Source region 502 and drain region 504 are generally formed using either an implantation/diffusion process or an etching/deposition process. In the former process, dopants such as boron, aluminum, antimony, phosphorous, or arsenic may be ion-implanted into the substrate to form the source region 502 and drain region 504. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate source region 502 and drain region 504. In some embodiments, the source region 502 and drain region 504 may be fabricated using a silicon alloy such as silicon germanium or silicon carbide. In some embodiments, the epitaxially deposited silicon alloy may be doped in-situ with dopants such as boron, arsenic, or phosphorous. In some embodiments, source region 502 and drain region 504 may be formed using one or more alternate semiconductor materials such as germanium or a suitable group III-V compound. In some embodiments, one or more layers of metal and/or metal alloys may be used to form source region 502 and drain region 504.

In some embodiments, gate contact 514 and drain contact 518 of the transistor 500 are disposed in first dielectric layer 520 disposed above substrate 501. In some embodiments, terminal B is disposed in second dielectric layer 522 disposed on first dielectric layer 520. In some embodiments, third dielectric layer 524 is disposed on the second dielectric layer 522. In some embodiments, fourth dielectric layer 526 is disposed on third dielectric layer 524. In some embodiments, source contact 516 is partially disposed in fourth dielectric layer 526, partially disposed in the third dielectric layer 524, partially disposed in second dielectric layer 522 and partially disposed on the first dielectric layer 520. In some embodiments, terminal B contact is disposed in third dielectric layer 524. In some embodiments, the conductive interconnect structure such as conductive interconnect structure 508 disposed in fourth dielectric layer 526.

In the illustrated embodiment of FIG. 5, gate contract 514 is formed in poly region; drain contact 518 is formed in active, poly, and Metal 0 (M0); electrode 306 is formed in Via 0-1 layer; COB 300 is formed in Metal 1 (M1) and Via 1-2; electrode 308 is formed in Metal 2 (M2), and conductor 508 is formed in Via 2-3 and Metal (M3). In some embodiments, COB 300 is formed in the metal 3 (M3) region.

In some embodiments, an n-type transistor M1 is formed in the frontend of the die while COB 300 is located in the backend of the die. In some embodiments, COB 300 is located in the backend metal layers or via layers for example in Via 3. In some embodiments, the electrical connectivity to the device is obtained in layers M0 and M4 or M1 and M5 or any set of two parallel interconnects. In some embodiments, COB 300 is formed in metal 2 (M2) and metal 1 (M1) layer region and/or Via 1-2 region.

While the embodiment of FIG. 5 is illustrated with reference to a frontend transistor M1, eDRAM cell can also be formed entirely in the backend. In some embodiments, access transistor M1 of the eDRAM cell may include a back end transistor that is coupled to ferroelectric capacitor 300 by sharing its source/drain terminal with one electrode of ferroelectric capacitor 300 and is used for both READ and WRITE access to ferroelectric capacitor 300.

FIGS. 6A-6L illustrate cross-sections 600, 620, 630, 640, 650, 660, 670, 680, 690, 695, 6950, and 6960, respectively, of a device showing fabrication of capacitive structure of FIG. 3B, in accordance with some embodiments.

Cross-section 600 illustrates a snapshot of the fabrication process after metal via 306 is formed in insulating material 310a (e.g., oxide SiO2), and after insulating material 310b (e.g., SioO2) is deposited over metal 306.

Cross-section 620 illustrates the process of etching through insulating material 310a for form an opening 621 that exposes the surface of metal via 306 (or interconnect). This opening 621 is the region where the capacitive structure is formed. Any suitable method (e.g., dry etch or wet etch) can be used form opening 621.

Cross-section 630 illustrates the process of depositing barrier layer 305 over metal via 306. In some embodiments, barrier layer 305 is optional and not deposited.

Cross-section 640 illustrates the process of depositing (e.g., by ALD) material for spacer 309. As described with reference to various embodiments, spacer 309 provides tensile strain along the x-axis to material 303 (to be deposited later) from the outside.

Cross-section 650 illustrates the process after the top layer of material 309 is etched out and surface polished or made ready for depositing first electrode material 301. Material 301 conforms along the surface of oxide 310b and spacer 309.

Cross-section 660 illustrates the process after electrode 301 along the surface of oxide 310b is removed or etched using any suitable method. Now the process is ready for depositing ferroelectric material 303, which is stabilized by spacer 309.

Cross-section 670 illustrates the process of depositing ferroelectric material 303 conformably overall oxide 310b and first electrode 301. The region between the vertical pillars of material 303 is used to form second electrode 302 and metal via 304. Spacer 309 applies tensile strain to material 303 so that material 303 acquires a sable orthorhombic phase resulting in a stable ferroelectric material.

Cross-section 680 illustrates the process of conformal deposition of second electrode 302 over ferroelectric material 303. Second electrode 302 forms the second terminal of the capacitive structure.

Cross-section 690 illustrates the etching of second electrode 302 along the upper layer of ferroelectric material 303 as shown. In some examples, second electrode 302 may not be removed.

Cross-section 695 illustrates the process after deposition of metal 304 between the vertical walls of second electrode 302. Metal 304 is then connected to interconnect 308.

Cross-section 6950 illustrates deposition of oxide or any suitable insulating material 310c over ferroelectric material 303.

Cross-section 6960 illustrates the process of a hole is formed in insulating material 310c for make electrical contact with metal structure 304. In some embodiments, second barrier material 307 is deposited conformably in the etched hole followed by deposition of interconnect material 308.

FIGS. 7A-7I illustrate cross-sections of a device showing fabrication of capacitive structure of FIG. 4B, in accordance with some embodiments. So as not to obscure the various embodiments, cross-section 700 is shown after the process forming oxide 310b, etching a hole 621, and depositing barrier layer 305 (optional). After barrier layer 305, first electrode 301 is conformably deposited over oxide 310b and barrier 305. In this case, spacer 309 is not deposited first.

Cross-section 720 illustrates the process of etching the horizontal surface of first electrode 301 along the surface of oxide 310b. After etching, the surface may be polished and made ready for deposition of ferroelectric material 303.

Cross-section 730 illustrates the process of conformably depositing (e.g., via ALD) ferroelectric material 303 over oxide 310b and first electrode 301. Cross-section 740 illustrates the deposition of second electrode 302 over ferroelectric material 303. Cross-section 750 illustrates the etching of second electrode 302 from the upper surface of the structure. As such, ferroelectric material 303 over oxide 310a is exposed. Cross-section 760 illustrates the deposition of inner spacer 409. Spacer 409 applies tensile strain to material 303 so that material 303 acquires a sable orthorhombic phase resulting in a stable ferroelectric material. Followed by deposition of spacer 409, oxide 310c is deposited. Cross-sections 770, 780, and 790 are similar to the process described with reference to cross-section 6960. In cross-section 770, a hole is etched to form contact with second electrode 302 and spacer 409. In cross-section 780, second barrier material 307 is deposited. In cross-section 790, material for second interconnect 308 is deposited over barrier material 307.

Figure 8:
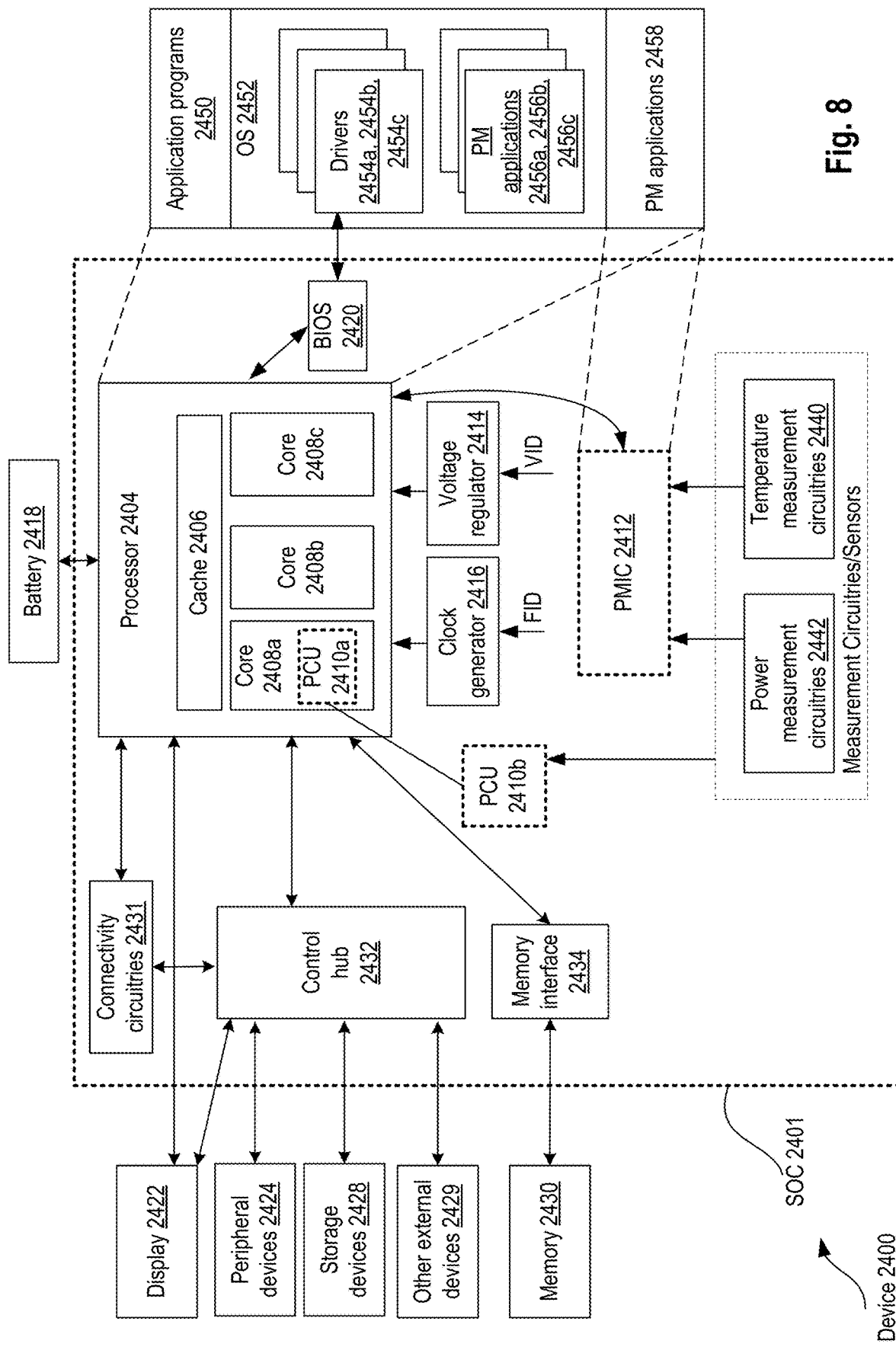
FIG. 8 illustrates a smart device, a computer system, or a SoC (System-on-Chip) including output spacers or and/or inner core (e.g., air, oxide, metal) to provide tensile stress to ferroelectric material of the COB, in accordance with some embodiments of the disclosure.

FIG. 8 illustrates a smart device, a computer system, or a SoC (System-on-Chip) including output spacers or and/or inner core (e.g., air, oxide, metal) to provide tensile stress to ferroelectric material of the COB, in accordance with some embodiments of the disclosure. It is pointed out that those elements of FIG. 8 having the same reference numbers (or names) as the elements of any other figure can operate or function in any manner similar to that described, but are not limited to such.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 8, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like.

The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 8, the processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2410a/b and/or PMIC 2412. In some embodiments, each core has a network of distributed LDOs to provide efficient control for power management. The LDOs can be digital, analog, or a combination of digital or analog LDOs.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples illustrates various embodiments. The examples can be combined in any suitable manner.

Example 1: An apparatus comprising: a first structure comprising metal; a second structure comprising metal; a third structure comprising ferroelectric or anti-ferroelectric material, wherein the third structure is between and adjacent to the first and second structures; and a fourth structure adjacent to the first structure, wherein the fourth structure is to provide tensile stress to the ferroelectric or anti-ferroelectric material, wherein the fourth structure comprises metal, semimetal, or oxide.

Example 2: The apparatus of example 1, wherein the fourth structure includes an oxide of one or more of: Al, Ti, Hf, Si, Ir, or N.

Example 3: The apparatus of example 1, wherein the fourth structure has a thickness in a range of 5 A to 100 A.

Example 4: The apparatus of example 1 comprising a fifth structure adjacent to the first structure, wherein the fifth structure comprises a barrier material, which includes Ta and N.

Example 5: The apparatus of example 1, wherein the ferroelectric or anti-ferroelectric material includes one or more of: Hf or Zr, and wherein the ferroelectric material has polar orthorhombic phase, or wherein the anti-ferroelectric material has tetragonal phase.

Example 6: The apparatus of example 1, wherein the ferroelectric or anti-ferroelectric material includes one or more of: Pb, Ti, Zr, Ba, N Si, La, Al, or Hf; and wherein the ferroelectric material has polar orthorhombic phase, or wherein the anti-ferroelectric material has tetragonal phase.

Example 7: The apparatus of example 1, wherein the ferroelectric or anti-ferroelectric material has a thickness in a range of 2 nm to 30 nm.

Example 8: The apparatus of example 1, wherein the ferroelectric material is a super lattice of a first material and a second material, wherein the first material includes one of: $PbTiO_3$ (PTO), $SrZrO_3$, or FeO3, and wherein the second material includes one of: $SrTiO_3$ (STO), $BaZrO_3$, or $YTiO_3$.

Example 9: An apparatus comprising: a bit-line; a word-line; a transistor coupled to the bit-line and the word-line; and a capacitor over the bit-line (COB), wherein the COB is coupled to ground and the transistor, wherein the COB comprises: a first structure comprising metal; a second structure comprising metal; a third structure comprising ferroelectric material, wherein the third structure is between and adjacent to the first and second structures; and a fourth structure adjacent to the first structure, wherein the fourth structure is to provide tensile stress to the ferroelectric material, and wherein the fourth structure comprises metal, semimetal, or oxide.

Example 10: The apparatus of example 9, wherein the fourth structure includes an oxide of one or more of: Al, Ti, Hf, Si, Ir, or N.

Example 11: The apparatus of example 9, wherein fourth structure has a thickness in a range of 5 A to 200 A.

Example 12: The apparatus of example 9 comprising: a first barrier structure adjacent to the first structure; and a second barrier structure adjacent to the first structure, wherein the first and second barrier structures comprise Ta and N.

Example 13: The apparatus of example 12 comprising a first interconnect adjacent to the first barrier; and a second interconnect adjacent to the second barrier.

Example 14: The apparatus of example 13, wherein the first and second interconnect comprise metal including one or more of: Cu, Al, graphene, carbon nanotube, Ay, Co, or Ti.

Example 15: The apparatus of claim 9, wherein the ferroelectric material includes one or more of: Hf or Zr; and wherein the ferroelectric material has polar orthorhombic phase.

Example 16: A system comprising: a processor; and a memory coupled to the processor, wherein the memory includes: a ferroelectric material between two electrodes; a material adjacent to one of the electrodes, wherein the material is to provide tensile stress to the ferroelectric material, and wherein the fourth structure comprises metal, semimetal, or oxide; and a wireless interface to allow the processor to communicate with another device.

Example 17: The system of example 16, wherein the two electrodes comprise metal including one or more of: Cu, Al, graphene, carbon nanotube, Au, Co, or Ti.

Example 18: The system of claim 16 wherein the material includes an oxide of one or more of: Al, Ti, Hf, Si, Ir, or N, and wherein the material has a thickness in a range of 5 A to 200 A.

Example 19: The system of example 16, wherein the ferroelectric or anti-ferroelectric material includes oxides of one or more of: Hf or Zr.

Example 20: The system of example 16, wherein the ferroelectric material has polar orthorhombic phase, or wherein the anti-ferroelectric material has tetragonal phase.

Example 21: An apparatus comprising: a first structure comprising metal; a second structure comprising metal; a third structure comprising ferroelectric material, wherein the third structure is between and adjacent to the first and second structures; and a fourth structure adjacent to the first structure, wherein the fourth structure is to provide tensile stress to the ferroelectric material, wherein the fourth structure comprises air.

Example 22: The apparatus of example 21 comprising a fifth structure adjacent to the first structure, wherein the fifth structure comprises a barrier material, which includes Ta and N.

Example 23: The apparatus of example 21, wherein the ferroelectric material includes one or more of: Hf or Zr, and wherein the ferroelectric material has polar orthorhombic phase.

Example 24: The apparatus of example 21, wherein the ferroelectric or anti-ferroelectric material includes one or more of: Pb, Ti, Zr, Ba, N Si, La, Al, or Hf; and wherein the ferroelectric material has polar orthorhombic phase, or wherein the anti-ferroelectric material has tetragonal phase.

Example 25: The apparatus of example 21, wherein the ferroelectric material has a thickness in a range of 2 nm to 20 nm.

Example 26: The apparatus of example 21, wherein the ferroelectric material is a super lattice of a first material and a second material, wherein the first material includes one of: $PbTiO_3$ (PTO), $SrZrO_3$, or FeO3, and wherein the second material includes one of: $SrTiO_3$ (STO), $BaZrO_3$, or $YTiO_3$.

Example 27: A method comprising: forming a first structure comprising metal; forming a second structure comprising metal; forming a third structure comprising ferroelectric or anti-ferroelectric material, wherein the third structure is between and adjacent to the first and second structures; and forming a fourth structure adjacent to the first structure, wherein the fourth structure is to provide tensile stress to the ferroelectric or anti-ferroelectric material, wherein the fourth structure comprises metal, semimetal, or oxide.

Example 28: The method of example 27, wherein forming the fourth structure includes forming an oxide of one or more of: Al, Ti, Hf, Si, Ir, or N.

Example 29: The method of claim 27, wherein the fourth structure has a thickness in a range of 5 A to 200 A.

Example 30: The method of example 27 comprising forming a fifth structure adjacent to the first structure, wherein forming the fifth structure comprises forming a barrier material, which includes Ta and N.

Example 31: The method of example 27, wherein forming the ferroelectric or anti-ferroelectric material includes forming one or more of: Hf or Zr, and wherein the ferroelectric material has polar orthorhombic phase.

Example 32: The method of example 27, wherein forming the ferroelectric or anti-ferroelectric material includes forming one or more of: Pb, Ti, Zr, Ba, N Si, La, Al, or Hf; and wherein the ferroelectric material has polar orthorhombic phase, or wherein the anti-ferroelectric material has tetragonal phase.

Example 33: The method of example 27, wherein the ferroelectric or anti-ferroelectric material has a thickness in a range of 2 nm to 30 nm.

Example 34: The method of example 27, wherein forming the ferroelectric material comprises forming a super lattice of a first material and a second material, wherein the first material includes one of: $PbTiO_3$ (PTO), $SrZrO_3$, or FeO3, and wherein the second material includes one of: $SrTiO_3$ (STO), $BaZrO_3$, or $YTiO_3$.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first structure comprising metal;
   a second structure comprising metal;
   a third structure comprising ferroelectric or anti-ferroelectric material, wherein the third structure is between and adjacent to the first and second structures;
   a fourth structure adjacent to the first structure, wherein the fourth structure is to provide tensile stress to the ferroelectric or anti-ferroelectric material, wherein the fourth structure comprises metal, semimetal, or oxide, and wherein the fourth structure has a thickness in a range of 5 A to 200 A;
   a first barrier structure adjacent to the first structure; and
   a second barrier structure adjacent to the first structure, wherein the first and second barrier structures comprise Ta and N.

2. The apparatus of claim 1, wherein the ferroelectric material is a super lattice of a first material and a second material, wherein the first material includes one of: $PbTiO_3$ (PTO), $SrZrO_3$, or FeO3, and wherein the second material includes one of: $SrTiO_3$ (STO), $BaZrO_3$, or $YTiO_3$.

3. The apparatus of claim 1, wherein the ferroelectric material includes one or more of: Hf or Zr, and wherein the ferroelectric material has polar orthorhombic phase or wherein the anti-ferroelectric material has tetragonal phase.

4. The apparatus of claim 1, wherein the ferroelectric material includes one or more of: Pb, Ti, Zr, Ba, N Si, La, Al, or Hf; and wherein the ferroelectric material has polar orthorhombic phase.

5. The apparatus of claim 1, wherein the fourth structure includes an oxide of one or more of: Al, Ti, Hf, Si, Jr, or N.

6. The apparatus of claim 1, wherein the ferroelectric material has a thickness in a range of 2 nm to 30 nm.

7. An apparatus comprising:
- a bit-line;
- a word-line;
- a transistor coupled to the bit-line and the word-line; and
- a capacitor over the bit-line (COB), wherein the COB is coupled to ground and the transistor, wherein the COB comprises:
  - a first structure comprising metal;
  - a second structure comprising metal;
  - a third structure comprising ferroelectric material, wherein the third structure is between and adjacent to the first and second structures;
  - a fourth structure adjacent to the first structure, wherein the fourth structure is to provide tensile stress to the ferroelectric material, wherein the fourth structure comprises metal, semimetal, or oxide, and wherein the fourth structure has a thickness in a range of 5 A to 200 A;
  - a first barrier structure adjacent to the first structure; and
  - a second barrier structure adjacent to the first structure, wherein the first and second barrier structures comprise Ta and N.

8. The apparatus of claim 7, wherein the ferroelectric material includes one or more of: Hf or Zr; and wherein the ferroelectric material has polar orthorhombic phase.

9. The apparatus of claim 7, wherein the fourth structure includes an oxide of one or more of: Al, Ti, Hf, Si, Ir, or N.

10. The apparatus of claim 7 comprising a first interconnect adjacent to the first barrier; and a second interconnect adjacent to the second barrier.

11. The apparatus of claim 10, wherein the first and second interconnect comprise metal including one or more of: Cu, Al, graphene, carbon nanotube, Ay, Co, or Ti.

* * * * *